(12) United States Patent
Kvatinsky et al.

(10) Patent No.: US 10,284,203 B2
(45) Date of Patent: *May 7, 2019

(54) PURE MEMRISTIVE LOGIC GATE

(71) Applicant: Technion Research and Development Foundation LTD., Haifa (IL)

(72) Inventors: Shahar Kvatinsky, Ramat Gan (IL); Dmitry Belousov, Netanya (IL); Slavik Liman, Tirat Carmel (IL); Nimrod Wald, Kfar Hanagid (IL); Guy Satat, Zichron Yakov (IL)

(73) Assignee: TECHNION RESEARCH AND DEVELOPMENT FOUNDATION LTD., Haifa (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/622,090

(22) Filed: Jun. 14, 2017

(65) Prior Publication Data
US 2018/0367149 A1    Dec. 20, 2018

(51) Int. Cl.
*H03K 19/20*  (2006.01)
*G11C 13/00*  (2006.01)

(52) U.S. Cl.
CPC ......... *H03K 19/20* (2013.01); *G11C 13/0002* (2013.01); *G11C 13/0069* (2013.01)

(58) Field of Classification Search
CPC ............. G11C 13/002; G11C 13/0069; G11C 13/0002; G11C 13/0004; G11C 13/0021; H03K 19/20; G06N 3/0635; G06N 3/08; G06N 3/063; G06N 3/049
USPC ............................ 365/148, 158, 163, 189.08
See application file for complete search history.

(56) References Cited

U.S. PATENT DOCUMENTS

| | | | |
|---|---|---|---|
| 9,685,954 B2 * | 6/2017 | Kvatinsky | H03K 19/00346 |
| 2017/0316309 A1 * | 11/2017 | Di Ventra | G06N 3/063 |
| 2017/0337968 A1 * | 11/2017 | Jagtap | G11C 13/0097 |
| 2017/0345497 A1 * | 11/2017 | Kvatinsky | H03K 19/20 |
| 2018/0075904 A1 * | 3/2018 | Ge | G11C 13/003 |

* cited by examiner

*Primary Examiner* — Tan T. Nguyen
(74) *Attorney, Agent, or Firm* — Reches Patents

(57) ABSTRACT

According to an embodiment of the invention there is provided a device and method. The device may include a pure memristive logic gate, wherein the pure memristive logic gate consists essentially of at least one input memristive device and an output memristive device that is coupled to and differs from the at least one memristive device; wherein the pure memristive device is controlled by a single control voltage.

19 Claims, 20 Drawing Sheets

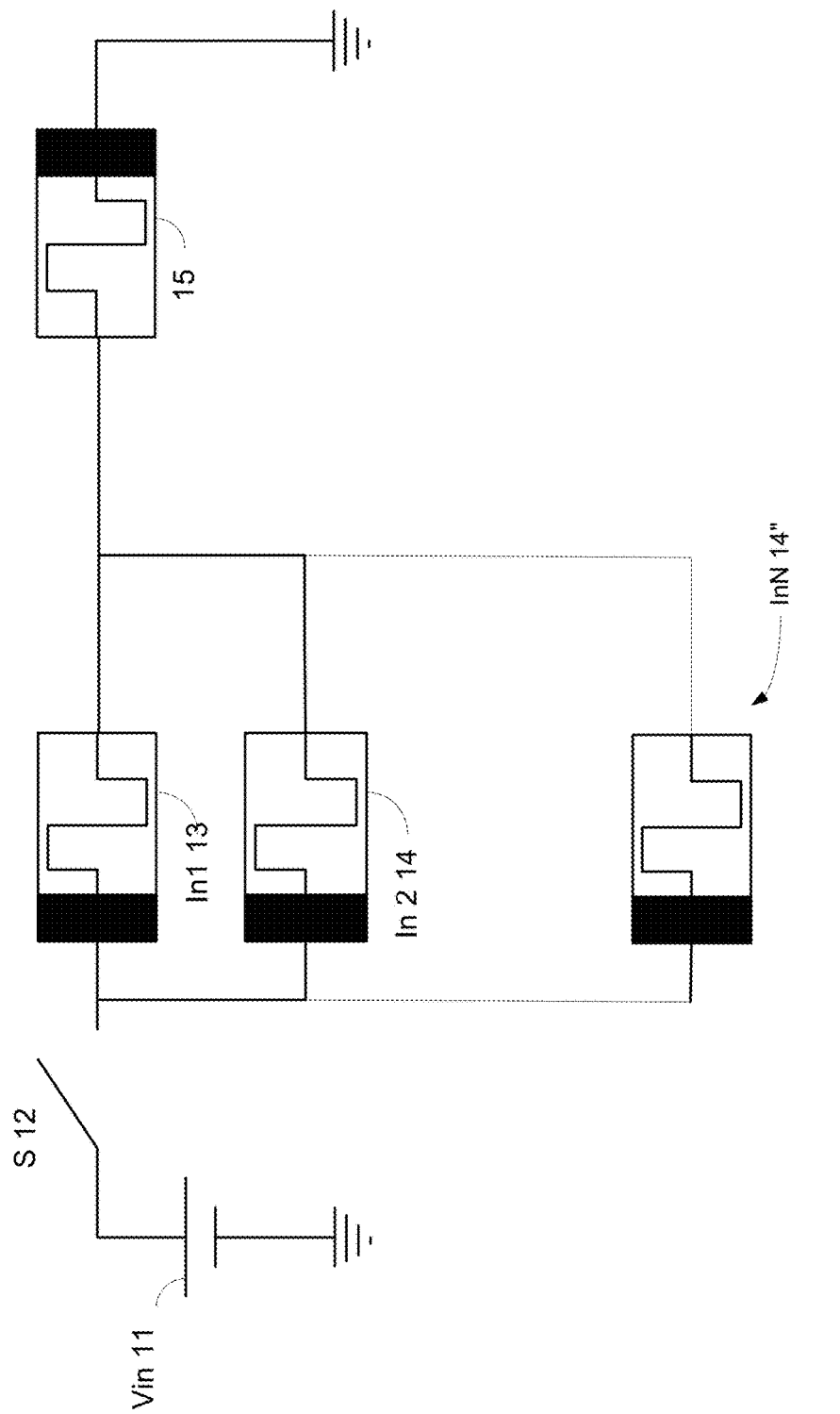

Memristor parameters for simulation

| | |
|---|---|
| $k_{on}$ | -216.2 m/sec |
| $k_{off}$ | 0.091 m/sec |
| $V_{T,ON}$ | -1.5 volt |
| $V_{T,OFF}$ | 0.3 volt |
| $x_{on}$ | 0 |
| $x_{off}$ | 3 nm |
| $a_{on}$ | 4 |
| $a_{off}$ | 4 |
| $R_{ON}$ | 1 kΩ |
| $R_{OFF}$ | 300 kΩ |

| Function | Design Constraints | Design Constraints - Multiple Inputs | Within Crossbar? |
|---|---|---|---|
| NOR | $2V_{T,OFF} < V_G < \min\left[\frac{R_{OFF}}{2R_{ON}} - V_{T,ON}, \|V_{T,ON}\|\right]$ | $\frac{V_{T,OFF}}{R_{ON}}\left[R_{ON} + \frac{R_{OFF}}{\zeta-1}\right] \| R_{ON} < V_G < \min\left[V_{T,OFF}\left(1 + \frac{R_{OFF}}{\zeta R_{ON}}\right)\left(1 + \frac{\zeta R_{ON}}{R_{OFF}}\right), \|V_{T,ON}\|\right]$ | Yes |
| NAND | $3V_{T,OFF} < V_G < \min\left[\|V_{T,ON}\|, \left(2 + \frac{R_{OFF}}{R_{ON}}\right)V_{T,OFF}\right]$ | $(\zeta+1)V_{T,OFF} < V_G < \min\left[\|V_{T,ON}\|\left(1 + \frac{\zeta R_{ON}}{R_{OFF}}\right), \frac{V_{T,OFF}}{R_{OFF}}\right]$ | No |
| OR | $V_{T,OFF} < V_G < 1.5V_{T,OFF}$ | $V_{T,OFF} < V_G < \left(1 + \frac{1}{\zeta}\right)V_{T,OFF}$ | No |
| AND | $V_{T,OFF} < V_G < 2V_{T,OFF}$ | $\left(\frac{R_{ON}}{R_{OFF}} + \chi\right)V_{T,OFF} < V_G < \left(2 + \frac{R_{ON}}{R_{OFF}}\right)(\zeta-1)V_{T,OFF}$ | No |
| NOT | $2V_{T,OFF} < V_G < \frac{R_{OFF}}{R_{ON}} \min(V_{T,OFF}, \|V_{T,ON}\|)$ |  | Yes |

PURE MEMRISTIVE LOGIC GATE

RELATED APPLICATION

This application is a continuation of U.S. patent application Ser. No. 14/034136, filing date Sep. 23, 2013 which in turn claims priority from U.S. provisional patent Ser. No. 61/950,114 filing date Mar. 9, 2014—both are incorporated herein by reference.

BACKGROUND OF THE INVENTION

In recent years the concept of a memristor, originally proposed by Leon Chua in 1971, has generated renewed interest. Chua proposed a forth fundamental component in addition to the three already well known fundamental electronic components: the resistor, capacitor, and inductor. Chua and Kang extended the memristor theory to memristive systems. Memristors and memristive devices are simple two-terminal resistors, where the resistance is changed by the electrical current. The resistance serves as a stored variable.

For almost forty years, the concept of memristors was just theory, as no one produced a component exhibiting the behavior of a memristor. In 2008, Hewlett Packard Laboratories announced that they had succeeded in producing memristors. Since 2008, several possible applications of memristors have been presented. Most emerging memory technologies, including Resistive RAM (RRAM) and Spin-Transfer Torque Magnetoresistive RAM (STT-MRAM) can be considered as memristors. The primary focus of memristor research in academia and industry has been memory. Another interesting application is memristor-based logic.

Material implication (IMPLY) as a memristor-based logic gate was presented. The memristor-based IMPLY logic gate is a natural implementation to be used in a memristive crossbar, which is the structure of commonly used memristive memory (especially for RRAM). The stored data within the memristor is the input and output of the logic gate. This method, however, is not intuitive and requires sequential voltage activation in different locations of the circuit. Furthermore, in IMPLY the result is stored in one of the inputs and not to a dedicated output memristor. The technique also requires extra circuit components (for example, a controller and an additional resistor in each row in the crossbar), dissipates high power, has high computation complexity, and requires complicated control.

There is a growing need to provide an improved memristive device based logic.

SUMMARY

According to an embodiment of the invention there may be provided a device that may include a pure memristive logic gate, wherein the pure memristive logic gate consists essentially of at least one input memristive device and an output memristive device that may be coupled to and differs from the at least one memristive device; wherein the pure memristive device may be controlled by a single control voltage.

The pure memristive logic gate may be arranged to operate in a first phase in which the output memristive device may be initialized to a known value and a second phase in which the single control voltage may be applied to one or more input memristive device of the at least one input memristive device thereby affecting state of the output memristor that may be an output of the pure memristive logic gate.

The polarity of the input memristive device may be reverse to a polarity of each input memristive device.

The polarity of the input memristive device may be same as a polarity of each input memristive device.

The pure memristive logic gate may be integrated with a memristive device memory array.

The pure memristive logic gate may be integrated with a memristive device crossbar that functions as a memristive memory array.

The pure memristive logic gate may be a NOT logic gate that consists essentially of a single input memristive device that may be serially coupled between a supplier of the single control voltage and the output memristive device.

The pure memristive logic gate may be an AND logic gate that consists essentially of multiple input memristive devices that may be coupled in serial to each other between a supplier of the single control voltage and the output memristive device, wherein a polarity of the multiple input memristive devices may be a same as a polarity of the output memristive device.

The pure memristive logic gate may be an OR logic gate that consists essentially of multiple input memristive devices that may be coupled in parallel to each other between a supplier of the single control voltage and the output memristive device; wherein a polarity of the multiple input memristive devices may be a same as a polarity of the output memristive device.

According to an embodiment of the invention there may be provided a method for performing a logic operation, the method may include: initializing an output memristive device of a pure memristive logic gate to a known value; and applying a single control voltage to one or more input memristive device of at least one input memristive device of the pure memristive logic gate thereby affecting state of an output memristor that may be an output of the pure memristive logic gate.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2C illustrates a pure memristive logic NAND gate that includes N input memristors according to an embodiment of the invention;

FIG. 11A illustrates parameters for circuit simulation according to an embodiment of the invention;

FIG. 12 illustrates design constraints of dual port pure memristive gates and of N input ports pure memristive gates according to an embodiment of the invention;

DETAILED DESCRIPTION OF THE DRAWINGS

Figure 1A:
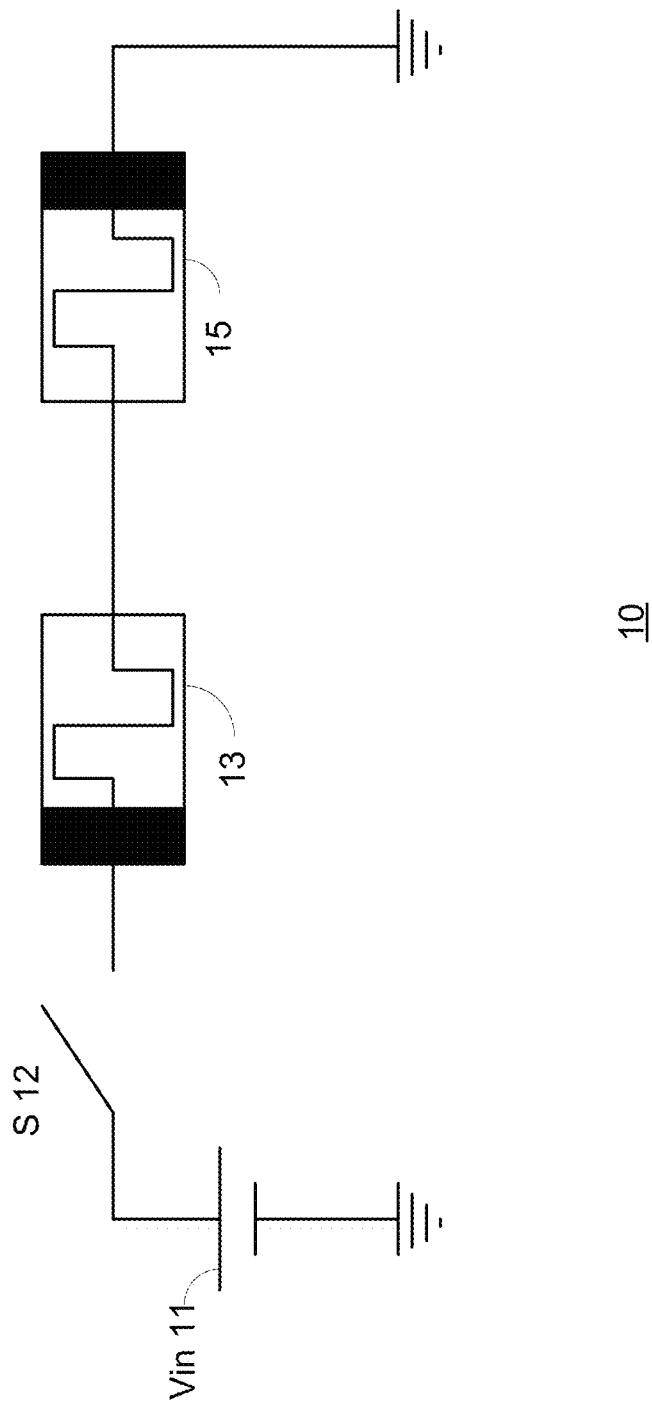
FIG. 1A illustrates a pure memristive logic NOT gate according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

The terms "memristive device" and "memristor" are used in an interchangeable manner Any reference to resistive memory device (for example RRAM) should be interpreted as a reference to any memristive device.

Memristor Aided LoGIC (MAGIC) is a technique to design pure memristive logic gates. The logic gates are purely memristive the sense that they include only memristive devices.

The logical state of a pure memristive logic gate is represented as resistance, where high and low resistances are considered, respectively, as logical zero and one (for simplicity, logical zero and logical one are considered, respectively, as $R_{off}$ and $R_{on}$). The input and output of the logic gates are the logical states of memristors. Unlike the IMPLY logic gate, there are separate memristors for input and output. The input of the pure memristive logic gate is the initial logical value of the input memristors and the output is the final logical state of a designated output memristor.

The operation of the pure memristive logic gates includes of two sequential stages. The first stage is the initialization of the output memristor to a known logical state. In the second stage of operation, a single voltage is applied to the logic gate. This is in distinguish from IMPLY, where two different voltages are applied to the memristors. The applied voltage creates a voltage divider, where the voltage upon the output memristor depends on the logical states of the input and output memristors. The nonlinearity characteristics of the memristor, which produce effective threshold currents and/or voltages [8], are exploited to maintain correct operation. For certain input, the voltage is sufficient to change the logical state of the output memristor, i.e., the voltage/current is greater than the threshold, while for other input cases the output remains as the initialize output logical state, i.e., the voltage/current is below threshold.

A pure memristive logic gate can therefore be fabricated within the memory, opening opportunity to perform logic within the memory, enabling new computer architectures, different than classical von Neumann architecture.

Enabling the opportunity to perform logic operations within the memory, without the need to have a different circuitry or to transfer the storage mechanism. i.e., the same memory can also be used to process data.

Pure Memristive Logic NOT Gate

A pure memristive logic NOT gate consists of an input memristor "in", an output memristor "S" and a controlled voltage source $V_{in}$. The memristors are connected in series and with opposite polarity. A schematic of a pure memristive logic NOT gate and simulation results are shown FIG. 1A. The pure memristive logic NOT gate 10 includes input memristor 13 and output memristor 15. The input memristor 13 is connected between a supplier (include voltage source 11 and switch 12) of a single control voltage Vin and the output memristor 15. The output memristor 15 is grounded.

Prior to the calculation the output memristor 15 must be set to logic '1'.

In case that the input is set to '0', the total resistance of the circuit is $R_{off}+R_{on}$, and this must cause the current to be below the current threshold $i_{off}$. In case that the input is '1', the total resistance is $2R_{on}$, and the current must be above the current threshold $i_{off}$ in order to achieve a change in the output. Combining the 2 conditions gives $$2i_{off}R_{on}<V_{in}<i_{off}(R_{off}+R_{on})$$ (Y.1)

A memristor might be asymmetric, having different response when switching to on or to off. This asymmetry may cause the current threshold to be different i.e. $i_{off} \neq i_{on}$. In that case, we can enforce a stricter criterion to keep the resistance of the input memristor unchanged. In case the input is set to '0', the current should be below the minimum of the current thresholds, i.e. minimum$\{|i_{on}|, |i_{off}|\}$. In case the input memristor is set to '1', the current direction attempts to decrease the resistance, thus not changing it. Combining this criterion to equation (Y.1) yields:

$$2i_{off}R_{on} < V_{in} < \text{minimum}\{|i_{off}|, |i_{on}|\} \cdot (R_{off}+R_{on}) \quad (Y.2)$$

Another aspect to be considered is the maximum change in the output memristor (switching from $R_{on}$ to $R_{off}$). In this case, the input memristor is set to '0', and as described above remains at '0' during the switch process. The output memristor resistance is initially $R_{on}$, and increases until the current reaches the threshold $i_{off}$. The output resistance at this time is $$R_S = \frac{V_{in}}{i_{off}} - R_{on}.$$

Thus in order to get as close as possible to $R_{off}$, $V_{in}$ must be as large as possible under the constraint in equation Y.2. If $i_{off} = i_{on}$ and $V_{in}$ is set at the upper limit, then $R_{s_{max,on \to off}} \approx R_{off}$.

Figure 1B:
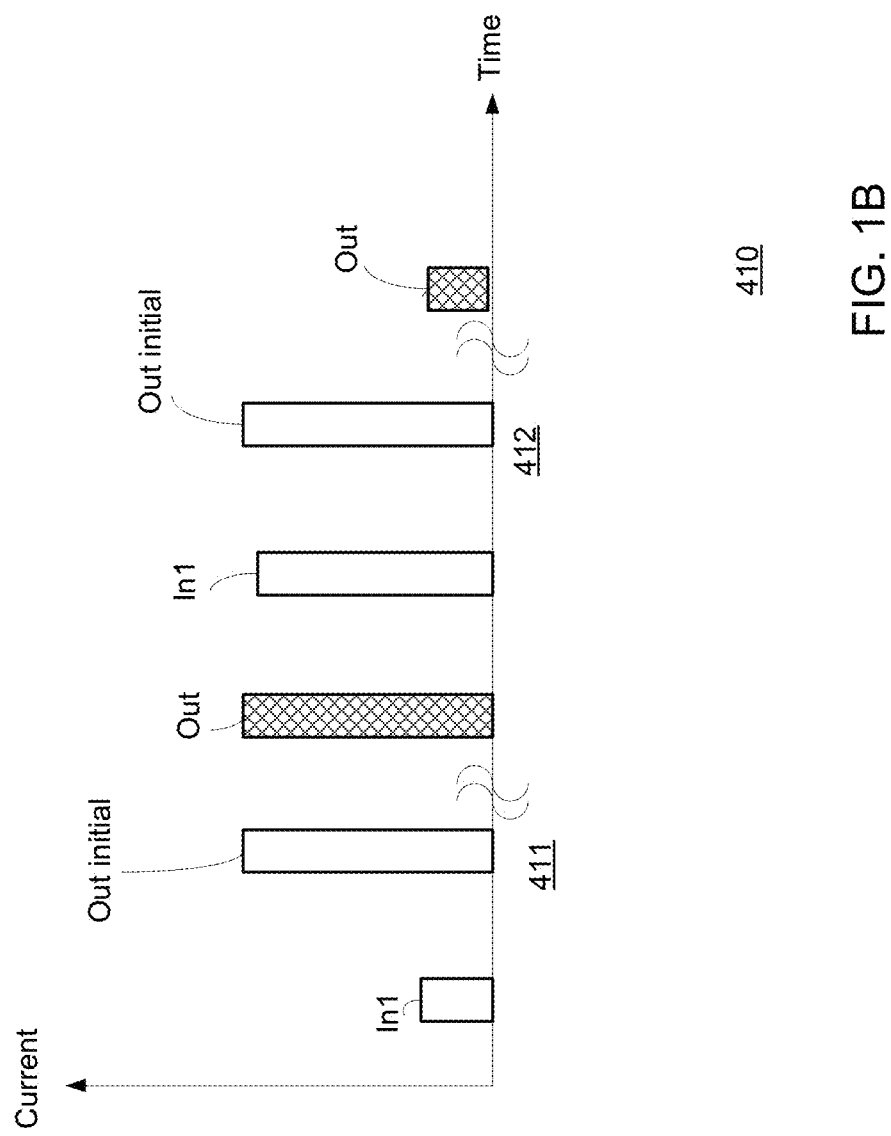
FIG. 1B illustrates various currents, initial output value and a final output value of the pure memristive logic NOT gate according to an embodiment of the invention.

FIG. 1B includes timing diagram 410 that illustrates two scenarios (411 and 412) that involve supplying various different currents to first memristor In1 13, an initial output current (initial out) read from the pure memristive logic NOT gate and a final output value (current read after execution of the logical NOT operation and applying Vo) of the pure memristive logic NOT gate according to an embodiment of the invention.

Pure Memristive NOR Logic Gate

Figure 2A:
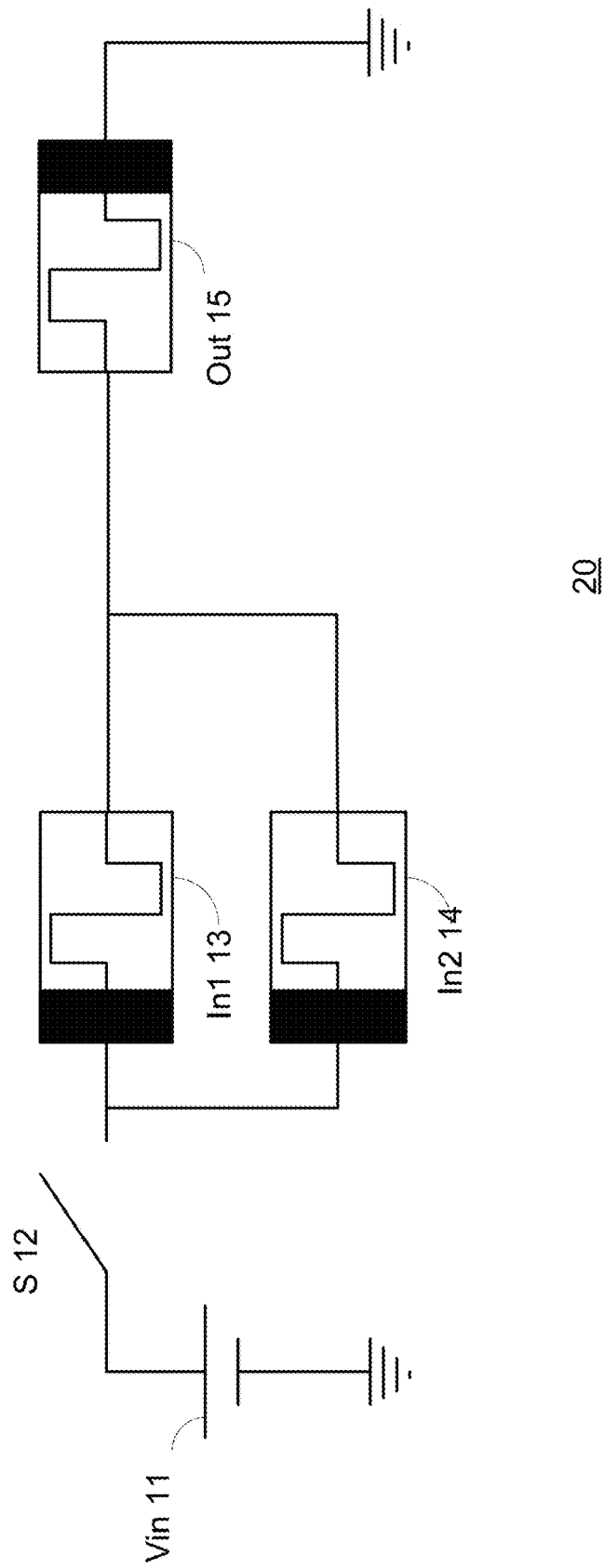
FIG. 2A illustrates a pure memristive logic NAND gate according to an embodiment of the invention.

A two input NOR logic gate consists of 2 input memristors in1, in2 connected in parallel, an output memristor with opposite polarity to the input memristors, and a controlled voltage source $V_{in}$. A schematic of a dual input NOR gate is shown in FIG. 2A.

The pure memristive logic NOR gate 20 includes input memristors (In1) 13 and (In2) 14 and output memristor (Out) 15. The polarity of the input memristors 13 and 14 is opposite to the polarity of the output memristor 15. The input memristors 13 and 14 are connected in parallel to each other between a supplier (include voltage source 11 and switch 12) of a single control voltage Vin and the output memristor 15. The output memristor 15 is grounded.

Prior to the calculation the output memristor must be set to '1'.

To satisfy NOR truth table, the value of the output memristor should remain at '1' only when the input memristors are set to '0'. In that case the effective resistance of the circuit is $$\frac{R_{off}}{2} + R_{on}$$

and the current should be smaller than the threshold $i_{off}$. Other combinations of the input memristors should change the output memristor to '0'. The stricter condition is when only one of the input memristors is set to '0'. In that case the effective resistance is $R_{off}||R_{on}+R_{on}$ and the current should be above the current threshold. Combining the conditions gives:

$$i_{off}(R_{off}||R_{on} + R_{on}) < V_{in} < i_{off}\left(\frac{R_{off}}{2} + R_{on}\right) \quad (Z.1)$$

For a multi input gate with $\chi$ inputs, the above condition becomes:

$$i_{off}\left(\frac{R_{off}}{\chi - 1}||R_{on} + R_{on}\right) < V_{in} < i_{off}\left(\frac{R_{off}}{\chi} + R_{on}\right) \quad (Z.2)$$

The configuration connecting the memristors guarantees that the values of the input memristors remain intact. In case all input memristors are set to '0', equation (Z.1) or (Z.2) guarantees the current is below the threshold. In case all input memristors are set to '1', they are at the minimal resistance $R_{on}$. Due to their polarity, current passing through them can only decrease their resistance, and thus their logical value remains the same. The complement case is when some of the input memristors are set to '1', and the others to '0'. Due to the ratio between $R_{on}$ to $R_{off}$ most of the current will pass thorough the memristors set to $R_{on}$, and similarly to the previous case their logical value remains the same. The part of the current that passes through the memristors which are set to $R_{off}$ is below the threshold.

If a memristor is asymmetric ($i_{off} \neq i_{on}$), a stricter criterion is needed in order to keep the input memristor unchanged. This will only affect the case in which all input memristors are set to '0'. In that case the current should be low enough not to change the input memristors and the output memristor, i.e. $i < \text{minimum}\{|i_{off}|, 2|i_{on}|\}$. Equations (Z.1), (Z.2) now become:

$$i_{off}(R_{off}||R_{on} + R_{on}) < V_{in} < \text{minimum}\{|i_{off}|, 2|i_{on}|\}\left(\frac{R_{off}}{2} + R_{on}\right) \quad (Z.1a)$$

$$i_{off}\left(\frac{R_{off}}{\chi - 1}||R_{on} + R_{on}\right) < V_{in} < \text{minimum}\{|i_{off}|, 2|i_{on}|\}\left(\frac{R_{off}}{\chi} + R_{on}\right) \quad (Z.2a)$$

To analyze effects on noise margin the maximum change in the resistance of the output memristor should be considered. For example, a 2 input NOR gate. In case one of the input memristors is set to '1', the maximum resistance of the output memristor is given by:

$$R_{s_{max}} = \frac{V_{in}}{i_{off}} - R_{off}||R_{on}. \text{ So, } V_{in}$$

should be set to the maximum value possible under condition (Z.1), in case of a symmetric memristor the maximum resistance of the output memristor is $$R_{s_{max}} = \frac{R_{off}}{2} + R_{on} - R_{off}||R_{on} \approx \frac{R_{off}}{2}.$$

Similar calculation for the case in which both input memristors set to '1' gives $$R_{s_{max}} = \frac{R_{off} + R_{on}}{2} \approx \frac{R_{off}}{2}. \text{ Since } R_{on} \ll R_{off}$$

this effect has small impact on 1 gate, but it effects the maximum number of gates connected in serial before amplifying the signal.

Figure 2B:
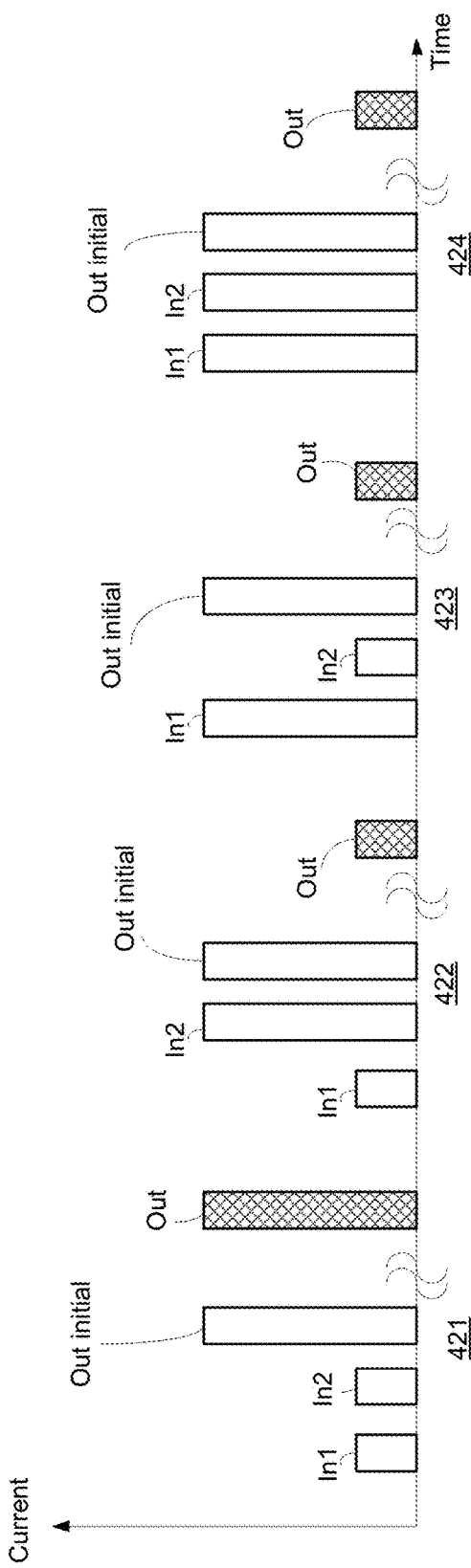
FIG. 2B illustrates various currents, initial output value and a final output value of the pure memristive logic NAND gate according to an embodiment of the invention.

FIG. 2B includes timing diagram 420 that illustrates four scenarios (412, 422, 423 and 424) that involve supplying various different currents to first and second memristor In1 13 and In2 14, an initial output current (initial out) read from the pure memristive logic NOR gate and a final output value (current read after execution of the logical NOR operation and applying Vo) of the pure memristive logic NOR gate according to an embodiment of the invention.

FIG. 2C illustrates a pure memristive logic NOR gate 20 that includes N (N exceeds 2) input memristors In1 13, In2 14 1 till InN 14" that are coupled to each other in parallel—instead of only two input memristors of FIG. 2A.

Pure Memristive NAND Logic Gate

Figure 3A:
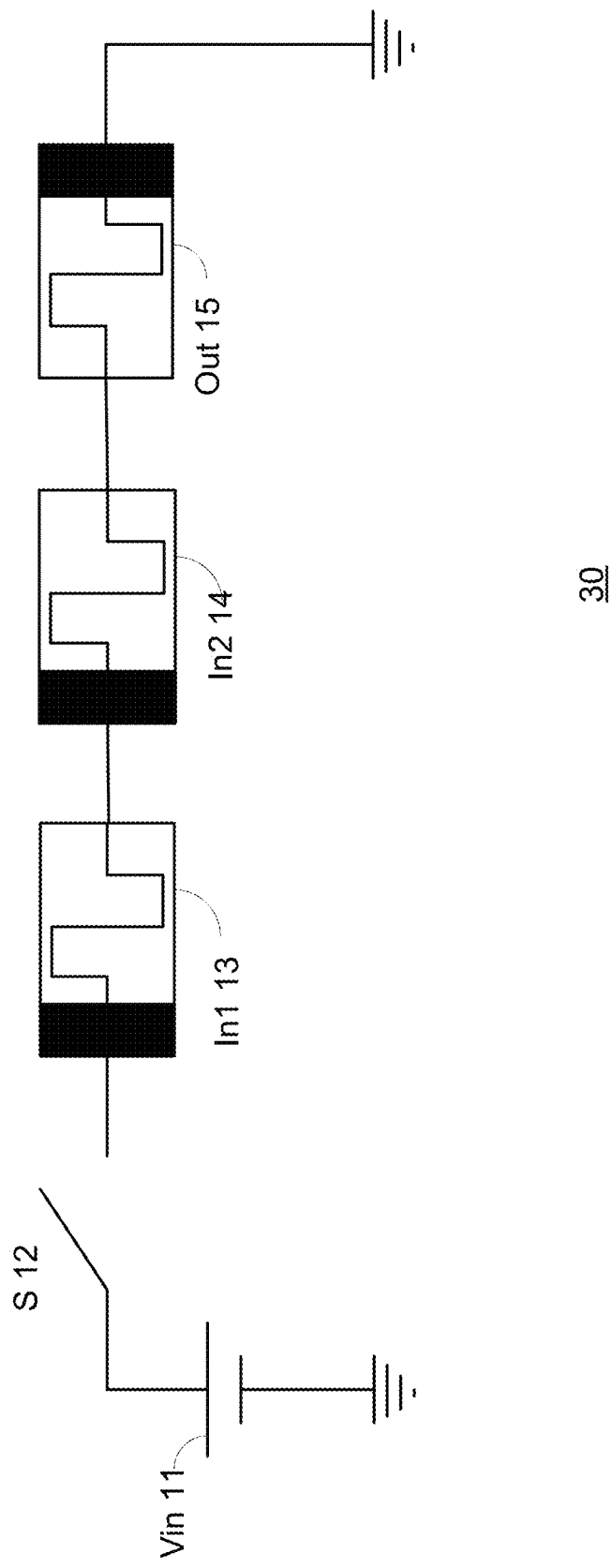
FIG. 3A illustrates a pure memristive logic NOR gate according to an embodiment of the invention.

A pure memristive NAND logic gate consists of two input memristor and an output memristor. The input memristors and the output memristor are connected in serial, when the polarity of the output memristor is opposite to the polarity of the input memristors. A schematic of a two input NAND logic gate is shown in FIG. 3A.

The pure memristive logic NAND gate 30 includes input memristor 13 AND 14 and output memristor 15. The input memristors 13 and 14 are serially connected between a supplier (include voltage source 11 and switch 12) of a single control voltage Vin and the output memristor 15. The polarity of the input memristors 13 and 14 is opposite to the polarity of the output memristor 15. The output memristor 15 is grounded.

The output memristor S must be set to logic '1' prior to the calculation.

In order to satisfy the NANDs gate truth table, a change in the output memristor is expected only in case that both input memristors are set to '1'. In that case the effective resistance of the 3 memristors is $3R_{on}$, and to achieve the change the current through S must be above the threshold $i_{off}$. In case that at least one of the input memristors is set to '0' no change is expected, and the current must be below the threshold. In this case the effective resistance of the 3 memristors is $R_{off}+2R_{on}$. Simulation results for two input NAND gate are shown in figure X(b). Combining the two requirements yields:

$$3i_{off}R_{on} < V_{in} < i_{off}(R_{off}+2R_{on}) \quad (X.1)$$

For a multi input gate with x input memristors the equivalent requirement is:

$$(1+\chi)i_{off}R_{on} < V_{in} < i_{off}((\chi-1)R_{off}+2R_{on}) \quad (X.2)$$

The configuration in which the memristors are connected guarantees that the value of the input memristors remains intact. The only case in which the current is above the switch threshold is when all the input memristors are set to '1'. Due to their polarity with respect to $V_{in}$, current passing through them can only decrease their resistance, but since it is already $R_{on}$ it remains as is. In other combinations of the input memristors the current is below the threshold thus no change is expected.

If the memristor is asymmetric, a stricter criterion is needed in order to keep the input memristor values unchanged. In case part of the input memristors are set to '0', the current must be smaller than the minimum of the current thresholds (minimum$\{|i_{on}|, |i_{off}|\}$). Thus, equation (X.1), (X.2) become:

$$3i_{off}R_{on} < V_{in} < \text{minimum}\{|i_{on}|, |i_{off}|\}(R_{off}+2R_{on}) \quad (X.1a)$$

$$(1+\chi)i_{off}R_{on} < V_{in} < \text{minimum}\{|i_{on}|, |i_{off}|\}((\chi-1)R_{off}+2R_{on}) \quad (X.2a)$$

Unlike the NOR gate, when the NAND gate switches from $R_{on}$ to $R_{off}$ the switch is maximal. The resistance of the output memristor when the current reaches the threshold is:

$$R_s = \frac{V_{in}}{i_{off}} - \chi R_{on}.$$

When using the largest $V_{in}$ possible under equation (X.3), and for a symmetric memristor the maximum value is $R_{s_{max}} \approx R_{off}$.

Figure 3B:
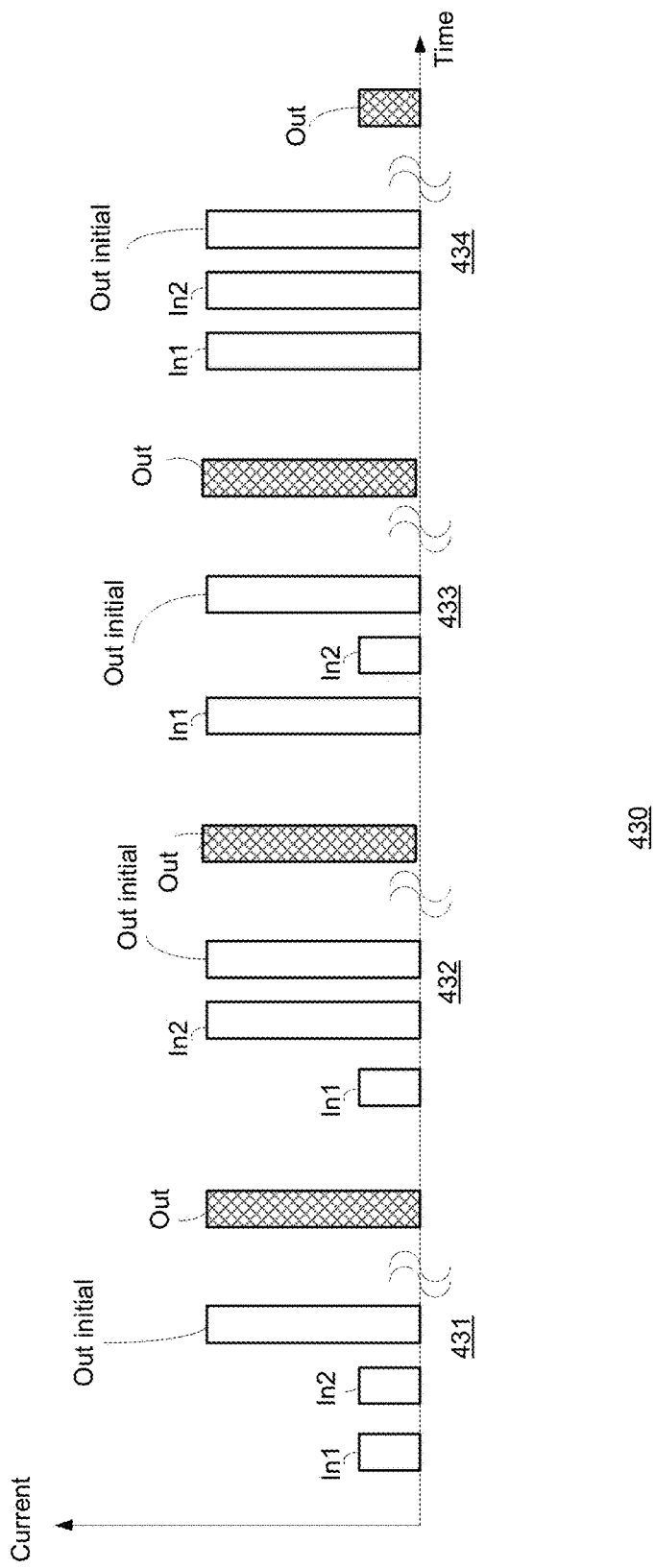
FIG. 3B illustrates various currents, initial output value and a final output value of the pure memristive logic NOR gate according to an embodiment of the invention.

FIG. 3B includes timing diagram 410 that illustrates four scenarios (432, 432, 433 and 434) that involve supplying various different currents to first and second memristor In1 13 and In2 14, an initial output current (initial out) read from the pure memristive logic NAND gate and a final output value (current read after execution of the logical NAND operation and applying Vo) of the pure memristive logic NAND gate according to an embodiment of the invention.

Figure 3C:
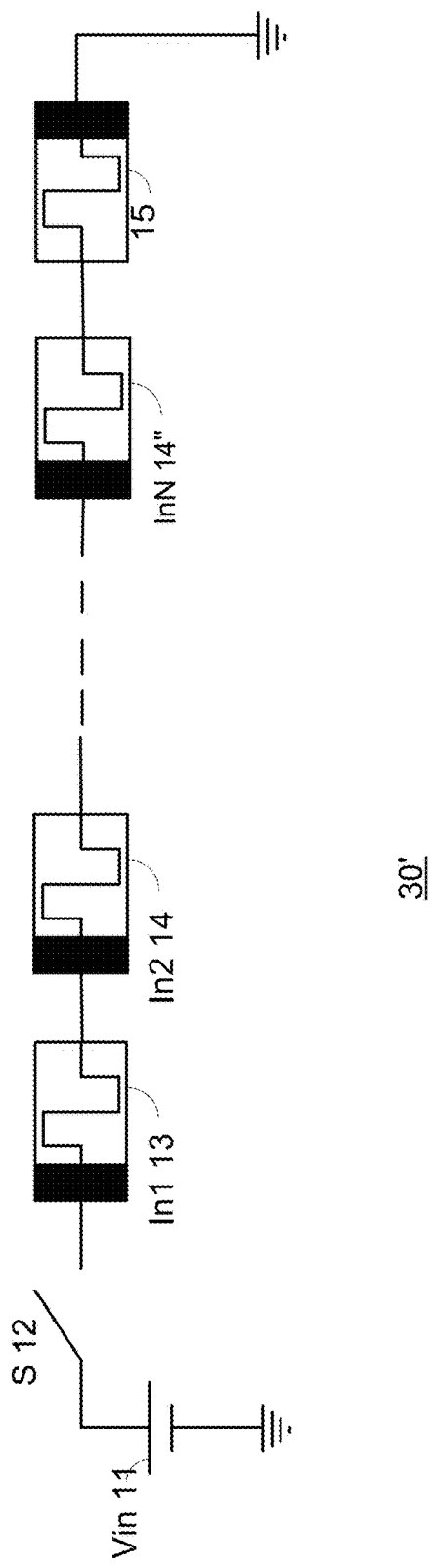
FIG. 3C illustrates a pure memristive logic NOR gate that includes N input memristors according to an embodiment of the invention.

FIG. 3C illustrates a pure memristive logic NAND gate 30' that includes N (N exceeds 2) input memristors In1 13, In2 14 till InN 14" that are coupled to each other in a serial manner—instead of only two input memristors of FIG. 3A.

Comparing between NOR and NAND gates

Since NOR and NAND are both a complete set, it is reasonable to compare between the 2 methods. Table 1 summarizes the differences:

TABLE 1

| | NOR | NAND |
|---|---|---|
| $V_{in}$-for 2 input and symmetric memristor | $i_{off}(R_{off} \| R_{on} + R_{on}) <$ $V_{in} < i_{off}\left(\frac{R_{off}}{2} + R_{on}\right)$ | $3 i_{off}R_{on} < V_{in} <$ $i_{off}(R_{off} + 2R_{on})$ |
| Example for characteristic values: $i_{on} = i_{off} = 10 \mu A$ $R_{off} = 100 k\Omega$ $R_{on} = 1 k\Omega$ | 0.0199 V < V < 0.51 V | 0.03 V < $V_{in}$ < 1.02 V |
| Initial set of $R_S$ | '1' = Ron | '1' = Ron |
| Probability to switch from initial set value to new value | 3/4 | 1/4 |
| Configuration | Very modular, can be part of cross bar. The output can easily be an input for another gate. Same memristor can be used to calculate NOT or NOR (depends on applied voltage) See "Implementation of NOR and NOT Logic Gates in Crossbar Form" later | |
| Maximum switch (effect on noise margin) | Switch from $R_{on}$ to $R_{off}$: the maximum resistance of the output memristor is $\frac{R_{off}}{2}$ | Switch from $R_{on}$ to $R_{off}$: the maximum resistance of the output memristor is $R_{off}$ |

Implementation of NOR and NOT Logic Gates in Cross Bar Form.

One of the benefits of using NOR, and NOT gates as presented above, is the ability to implement the gates in a multifunctional crossbar form. A crossbar is presented in figure Z. It should be noted that the polarities of all memristors with respect to the driver is identical, as it is in the NOT and NOR gates.

In order to implement the gates as described, a voltage driver is needed. The driver should be able to drive several voltage levels: Ground, $V_{set}$ (to set a memristor to '1'), $V_{NOR}$ ($V_{in}$ for NOR calculation), $V_{NOT}$ ($V_{in}$ for NOT calculation) and to float.

In the next paragraph it is assumed that a driver is floating unless stated otherwise.

Implementing NOR requires these steps: Initialize the output memristor by applying $V_{set}$ to driver D and ground to driver A. Calculate the result by applying $V_{NOR}$ to drivers B and C, and ground to driver D.

Implementing NOT requires these steps: Initialize the output memristor by applying $V_{set}$ to driver D and ground to driver A. Calculate the result by applying $V_{NOT}$ to driver B, and ground to driver D.

The advantages of using this crossbar form with NOR and/or NOT gates are:
- Any memristor on the crossbar can be part of any calculation.
- The output of any calculation can easily be used as an input for the next one.
- NOT and NOR can be done on the same set of memristors—no structural change.
- Crossbar can be used to compute multiple functions, the only change is in the controller.
- NOR constitutes a complete set of operations, therefore it is possible to implement any logic function on a crossbar large enough.

The disadvantage of using this form is the requirement of different voltages to compute different functions (since NOR is a complete set of operations, this is not necessarily a disadvantage).

Pure Memristive AND Logic Gate

Figure 4A:
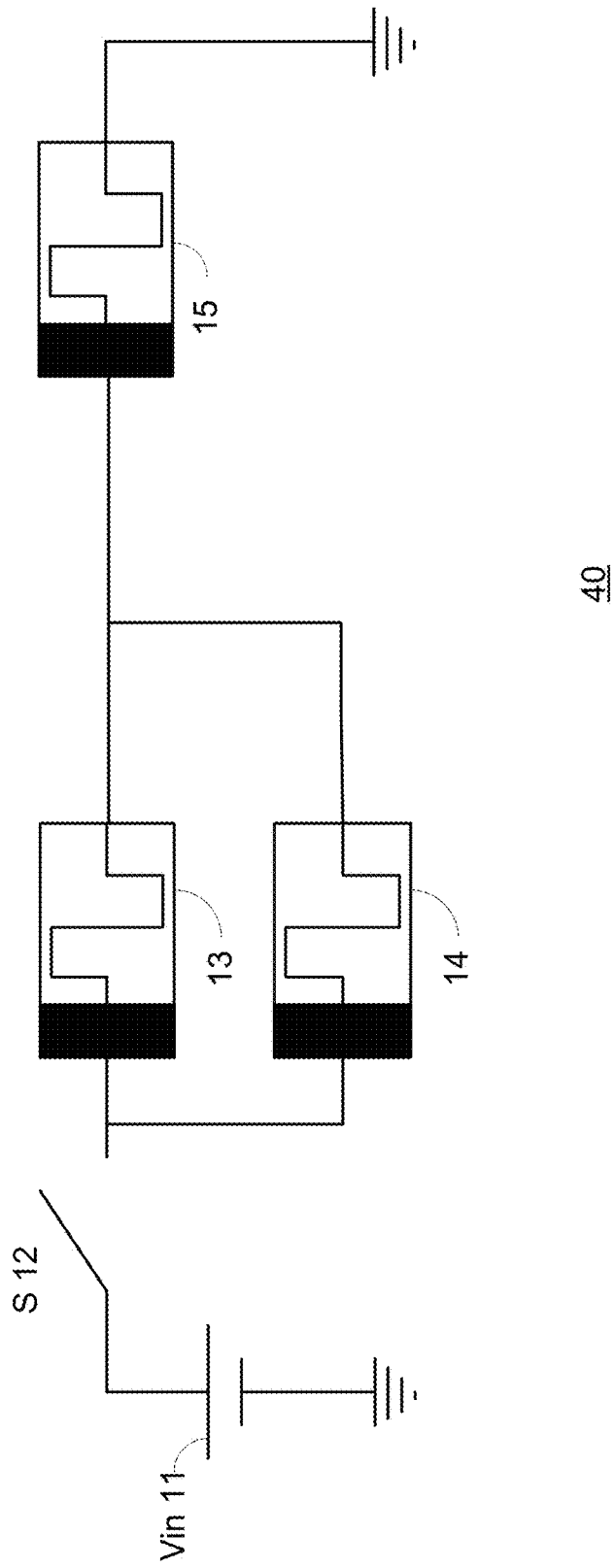
FIG. 4A illustrates a pure memristive logic AND gate according to an embodiment of the invention.

A two input AND logic gate consists of three memristors connected in series. Two of the memristors are input memristors (in1, in2) and the additional memristor is the output out. A schematic of a two input AND logic gate is shown in FIG. 4A.

The pure memristive logic NAND gate 40 includes input memristor 13 AND 14 and output memristor 15. The input memristors 13 and 14 are serially connected between a supplier (include voltage source 11 and switch 12) of a single control voltage Vin and the output memristor 15. The polarity of the input memristors 13 and 14 is the same as the polarity of the output memristor 15. The output memristor 15 is grounded.

The first execution step includes resetting (write logical zero) the output memristor out and, if necessary, writing the input value into memristors in1 and in2. In the second execution step, the evaluation is performed by applying a voltage pulse Vo to the gateway of the logic gate. The applied voltage produces current through the circuit and memristor out. For the case when both input memristors are logical one (low resistance), the current/voltage of the output memristor is relatively high (greater than the memristor threshold) and the logical state of the output memristor is switched to logical one. For all other input cases, the current is relatively low and the current/voltage upon the output memristor is below threshold. The logical state of the output memristor does not change and is logical zero.

The exact applied voltage for execution depends on the threshold of the memristor. Assume a memristor with "on" voltage threshold of $V_{T,ON}$ and "off" voltage threshold $V_{T,OFF}$. In the case where both inputs are logical one, the voltage upon the output memristor is relatively high since its initial resistance is high and the resistance of both input memristors is low. The voltage upon the output memristor is greater than threshold and the logical state of the output memristor is therefore switched to logical one. In all other input cases, the voltage upon the output memristor is below threshold. The maximal voltage upon the output memristor that is below threshold is achieved where one input is logical one and the other input is logical zero.

Combining the cases where the voltage upon the output memristor is above and below threshold leads to design constraints on the applied voltage Vo. The constraints are (assume $R_{off} \gg R_{on}$):

$$V_{T,ON} < V_0 < 2V_{T,ON}. \quad (1)$$

Multiple-input (three or more) AND logic gates can also be designed in a similar manner For $\chi$ input memristors, the design constraints can also be determined. The design constraints are $$\left(1 + \frac{R_{ON}}{R_{OFF}}\chi\right)V_{T,ON} < V_0 < \left(2 + \frac{R_{ON}}{R_{OFF}}(\chi - 1)\right)V_{T,ON}. \quad (2)$$

For small $\chi$, (2) is approximately (1)

Figure 4B:
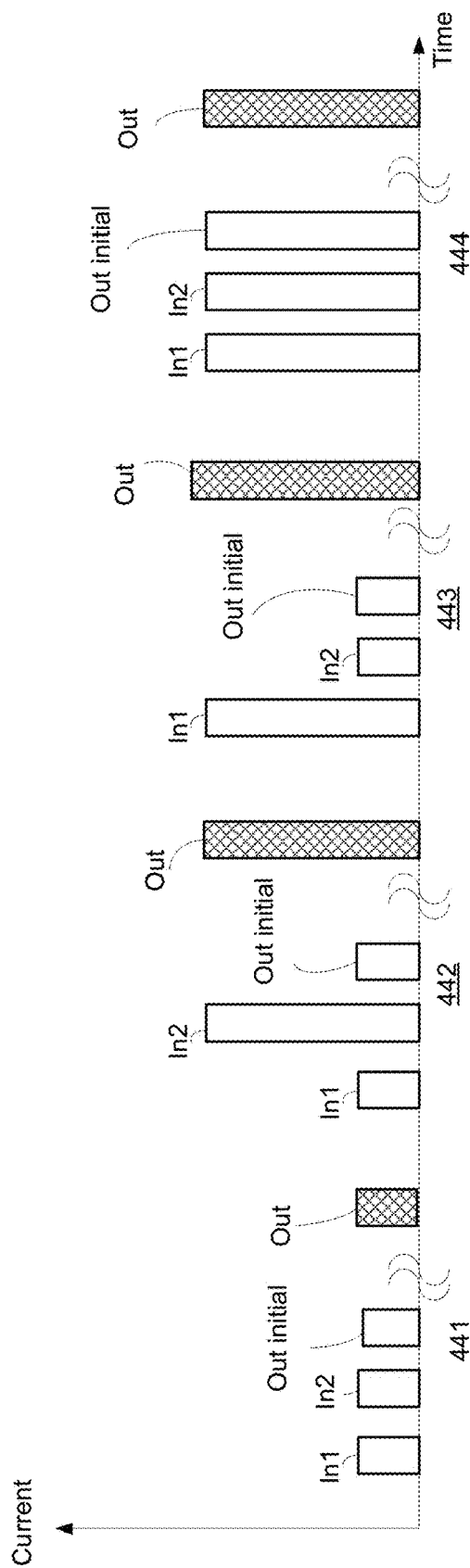
FIG. 4B illustrates various currents, initial output value and a final output value of the pure memristive logic AND gate according to an embodiment of the invention.

FIG. 4B includes timing diagram 440 that illustrates four scenarios (442, 442, 443 and 444) that involve supplying various different currents to first and second memristor In1 13 and In2 14, an initial output current (initial out) read from the pure memristive logic AND gate and a final output value (current read after execution of the logical AND operation and applying Vo) of the pure memristive logic AND gate according to an embodiment of the invention.

Pure Memristive OR Logic Gate

Figure 5A:
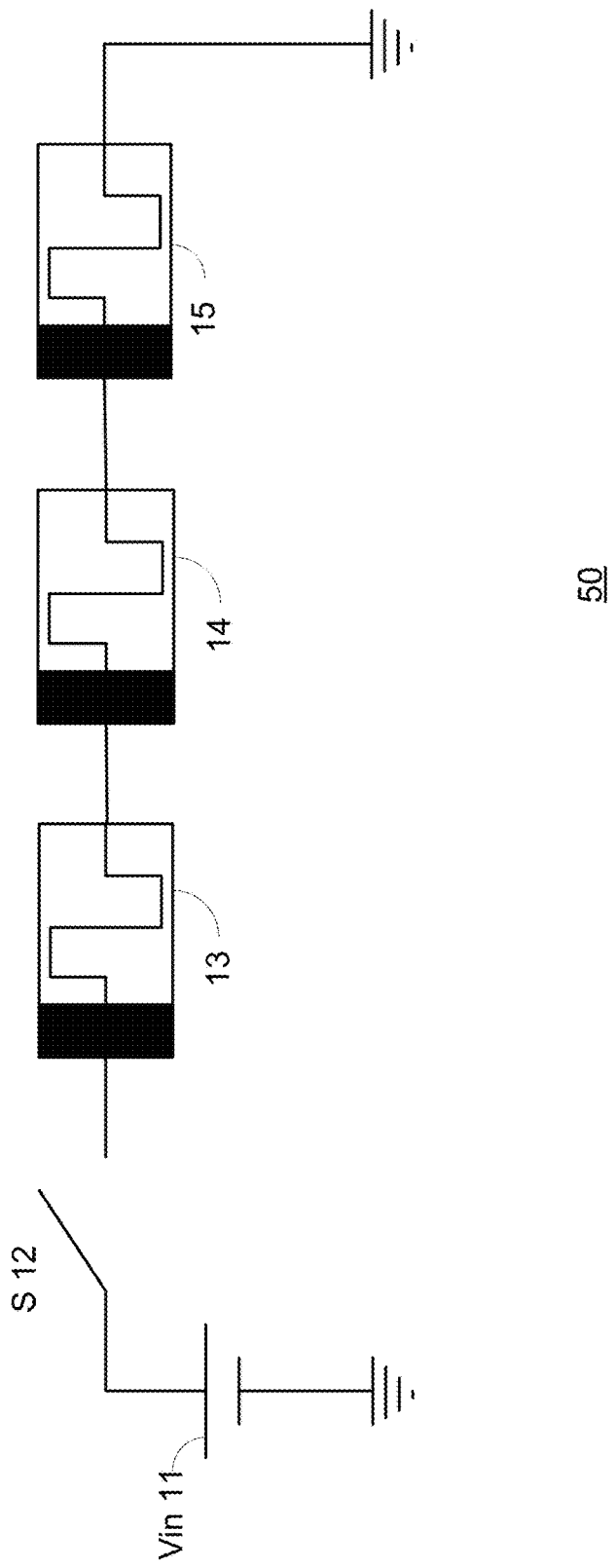
FIG. 5A illustrates a pure memristive logic OR gate according to an embodiment of the invention.

A two input OR gate consists of two input memristors in1 and in2 connected in parallel and an output memristor out, as shown in FIG. 5A.

The pure memristive logic OR gate 50 includes input memristors 13 and 14 and output memristor 15. The polarity of the input memristors 13 and 14 is the same as the polarity of the output memristor 15. The input memristors 13 and 14 are connected in parallel to each other between a supplier (include voltage source 11 and switch 12) of a single control voltage Vin and the output memristor 15. The output memristor 15 is grounded.

The execution procedure is similar to the AND logic gate, where the output memristor is initialized to logical zero.

When applying Vo to the gateway of the circuit, the voltage upon the output memristor depends on the equivalent resistance of both input memristors. The resistance of two memristors connected in parallel is primary determined by the smallest resistance. When both inputs are logical one, the initial resistance of the circuit is $1.5R_{off}$. For this resistance, the current of the output memristor is relatively small and the current/voltage is below threshold. The logical state of the output memristor therefore remains logical zero. For all other input cases, the resistance of the circuit is approximately $R_{off} + R_{on}$, producing a relatively high current, sufficient to switch the logical state of the output memristor to logical one.

The design constraints on the applied voltage $V_0$ can be determined similarly to (1), where the conditions of the input cases are compared and are (assume $R_{off} \gg R_{on}$)

$$V_{T,ON} < V_0 < 1.5 V_{T,ON}, \quad (3)$$

Similar to the AND logic gate, a multi-input OR gate is possible. For $\chi$ input memristors, the equivalent design constraints are $$V_{T,ON} < V_0 < (1 + 1/\chi) V_{T,ON}. \quad (4)$$

Increasing the number of inputs makes the constraint on $V_0$ tighter. The circuit is therefore less immune to noise and variations for large number of inputs.

Figure 5B:
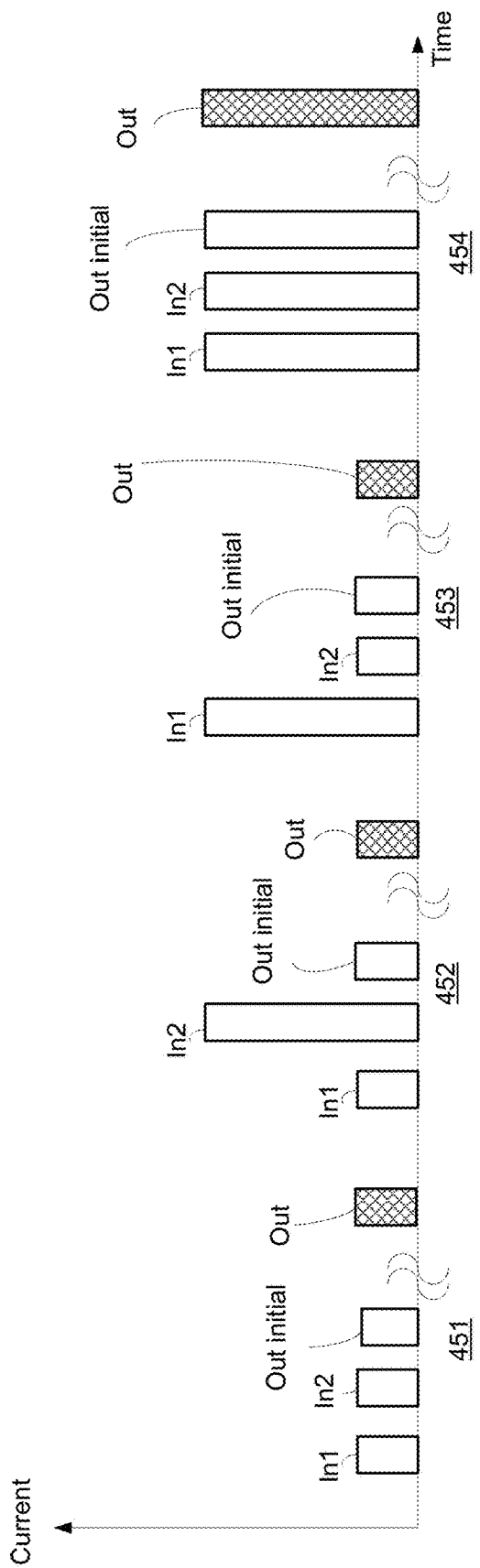
FIG. 5B illustrates various currents, initial output value and a final output value of the pure memristive logic OR gate according to an embodiment of the invention.

FIG. 5B includes timing diagram 450 that illustrates four scenarios (451, 452, 453 and 454) that involve supplying various different currents to first and second memristor In1 13 and In2 14, an initial output current (initial out) read from the pure memristive logic OR gate and a final output value (current read after execution of the logical OR operation and applying Vo) of the pure memristive logic OR gate according to an embodiment of the invention.

Figure 6:
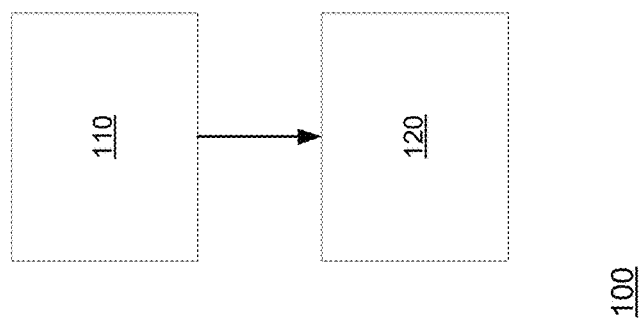
FIG. 6 illustrates a method according to an embodiment of the invention.

FIG. 6 illustrates method 100 according to an embodiment of the invention.

Method 100 may start by stage 110 of initializing an output memristive device of a pure memristive logic gate to a known value.

Stage 110 may be followed by stage 120 of applying a single control voltage to one or more input memristive device of at least one input memristive device of the pure memristive logic gate thereby affecting state of an output memristor that is an output of the pure memristive logic gate.

Figure 7:
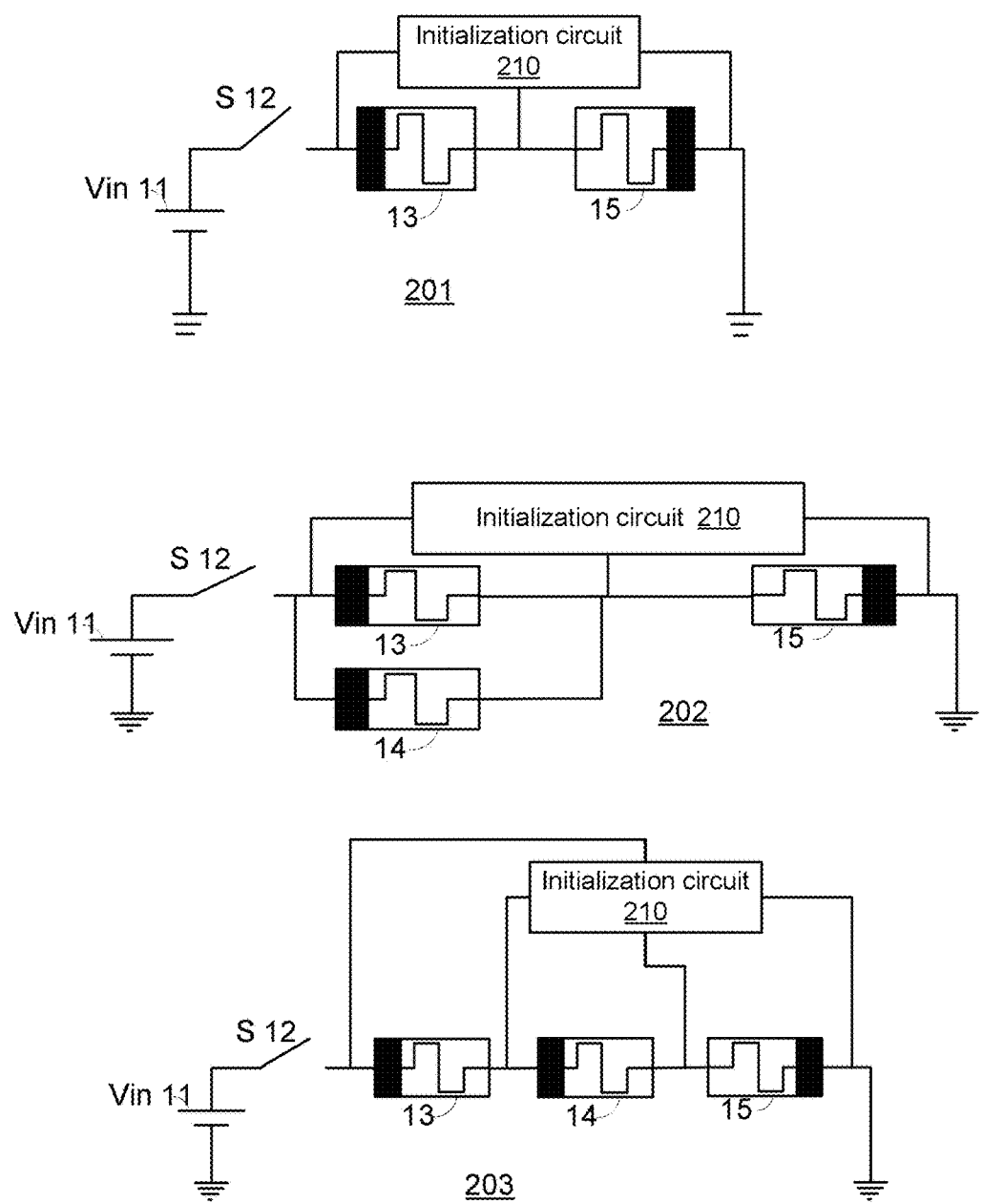
FIG. 7 illustrates pure memristive logic gates and an initialization circuit according to an embodiment of the invention.

FIG. 7 illustrates three portions 201, 202 and 203 of a device, each portion includes a pure memristive logical gate (10, 20 and 30) and an initialization circuit 210 according to various embodiment of the invention. The initialization circuit 210 may initialize one or more memristive devices of each pure memristive logical gate by determining a resistance of the memristive device. The initialization circuit 210 may be connected to each (or some) end (terminal) of each memristive device.

Figure 8:
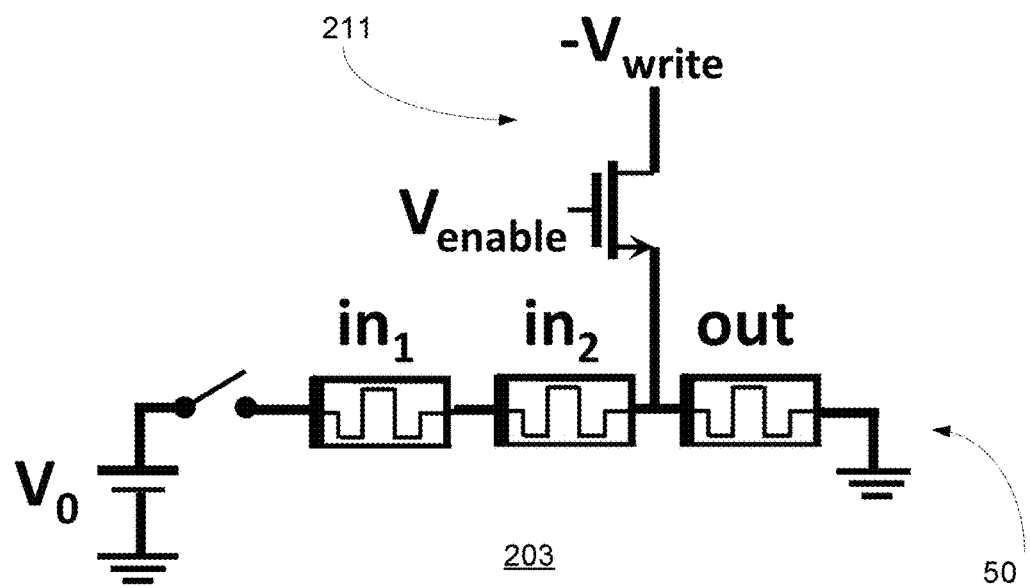
FIG. 8-9 illustrates two examples of pure memristive logic gates and initialization circuits according to an embodiment of the invention.

FIG. 8 illustrate a portion 211 of initialization device 210 that writes a logical zero value to output memristor 13 of pure memristive logic OR gate 50, according to an embodiment of the invention.

Figure 9:
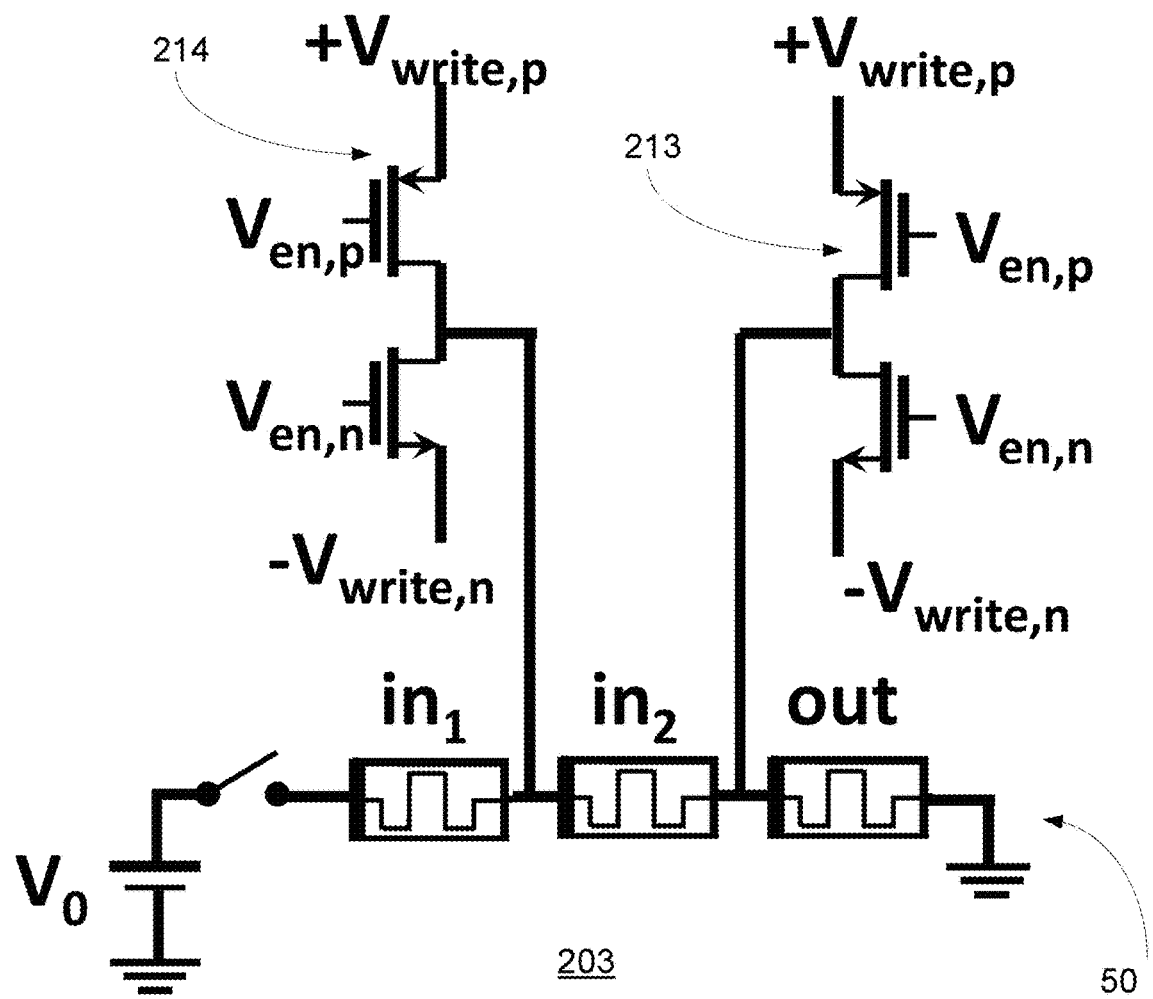

FIG. 9 illustrate portions 212 and 213 of initialization device 210 that are arranged to write any logical zero value to input memristor 14 (In2) of pure memristive logic OR gate 50, according to an embodiment of the invention.

It is noted that any initialization circuit can be provided. An initialization circuit is any circuit that can set the resistance of a memristive device. Non-limiting examples of initializing circuits are illustrated in, "Practical Approach to Programmable Analog Circuits With Memristors', Yuriy Pershin and Massimiliano D e Ventra, IEEE Transactions on circuits and systems-I: Regular papers, Vol. 57, No. 8, August 2010 and in "Accessibility of Nano-Crossbar Arrays of Resistive Switching Devices", An Chen, 2011 11$^{th}$ IEEE International Conference on Nanotechnology, Portland Marriott, Aug. 15-18, 2011, Portland, Oreg., USA. The latter illustrates an initialization of memristive devices that are arranged in a crossbar using bitline and wordlines.

Figure 10:
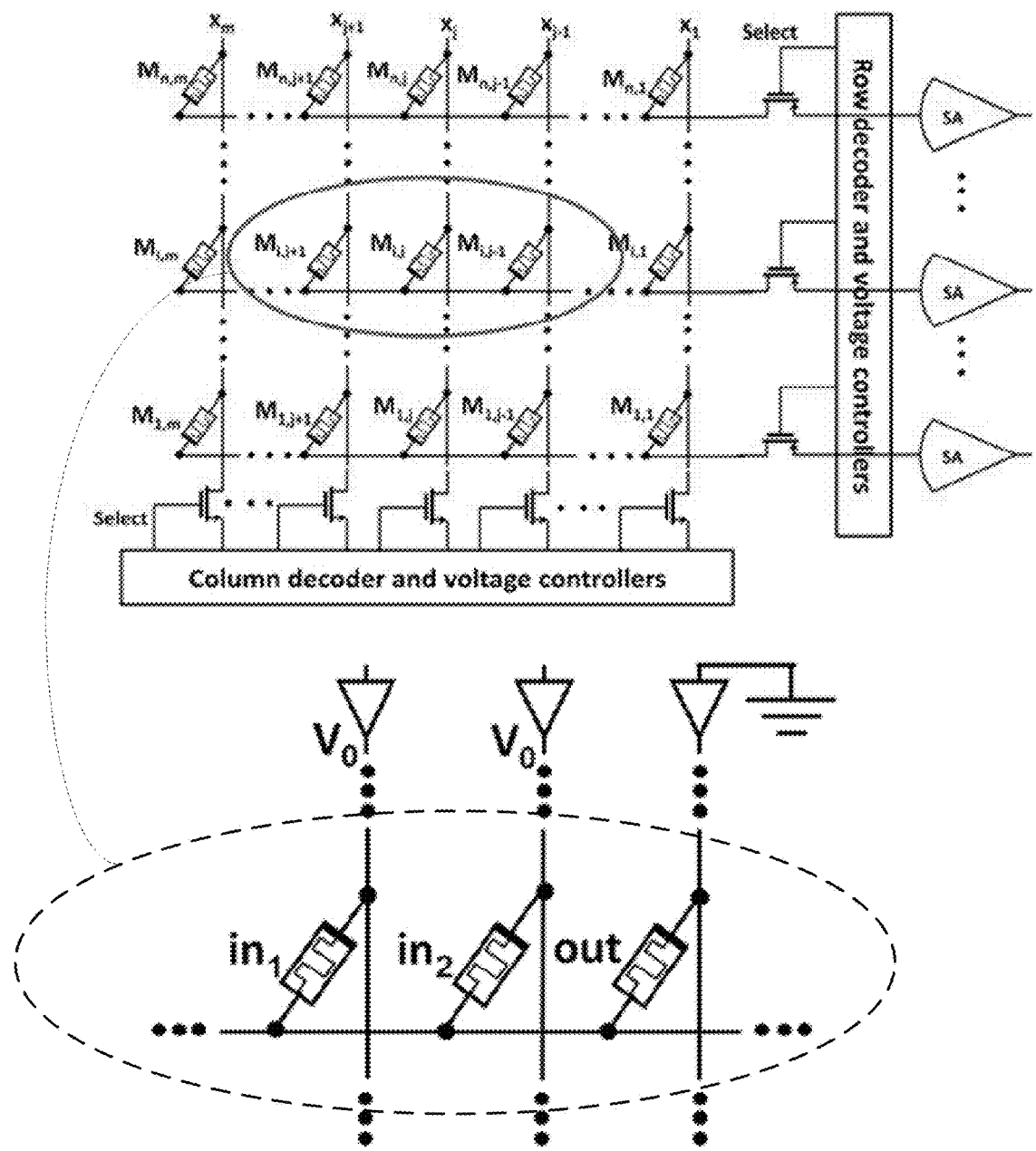
FIG. 10 illustrates a crossbar and pure memristive logic gates according to an embodiment of the invention.

FIG. 10 illustrates a crossbar 300 and pure memristive logic gates according to an embodiment of the invention.

In crossbar 300 the memristors are arranged in a rectangular array between row and column lines. The column lines are coupled to switches and to column decoders and voltage controllers. The row lines are coupled to switches and to row decoders and voltage controllers that in turn are connected to amplifiers (SA).

In FIG. 10 a two input NOR gate is achieved in row i, where in1 and in2 are, respectively, in columns j+1 and j and out is in column j−1, as marked by an oval. The voltage at the gateway V0 is the applied voltage at columns j and j+1, while column j−1 is connected to ground.

Evaluation and Design Considerations for a Magic NOR Gate

The speed of a MAGIC NOR gate is evaluated in SPICE for a 0.18 μm CMOS process. A memristor model, the VTEAM model, which extends the TEAM model with a threshold voltage, is used with a Biolek window function.

The parameters of the memristors are chosen to produce a switching time of 1 ns for a voltage pulse of 1 volt for RESET and 2 volts for SET, and to fit practical devices.

The parameters of the circuit simulations are listed in table 520 of FIG. 11A.

Figure 11B:
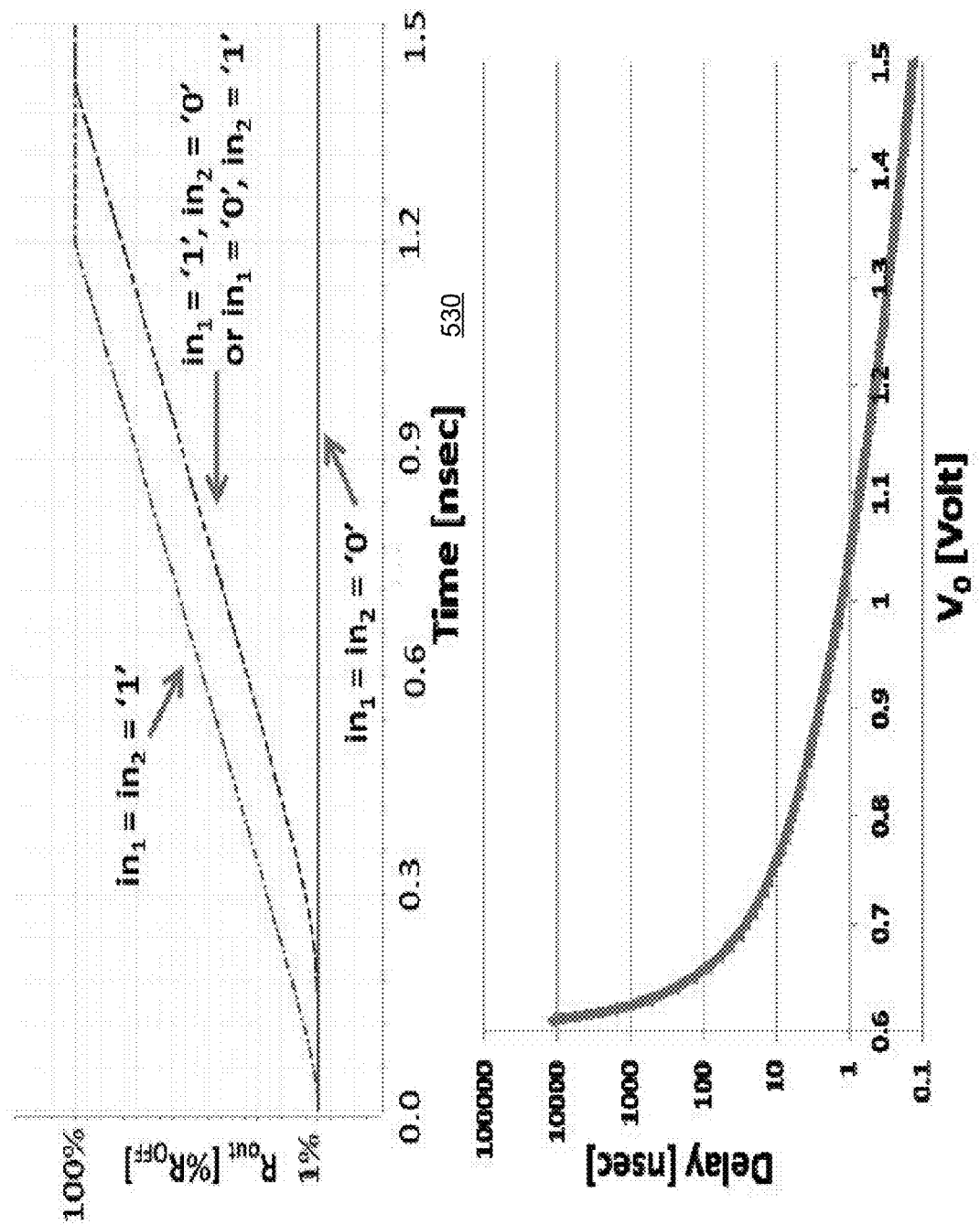
FIG. 11B illustrates a behavior and speed of a pure memristive logic NOR gate for different values of V0 according to an embodiment of the invention.

The behavior and speed of a MAGIC NOR gate for different values of V0 are shown in FIG. 11B.

To evaluate the delay of the logic gate, the slowest input case is considered. The delay of a MAGIC NOR gate is determined from an input combinations of {1,0} or {0,1}.

V0 can vary from 0.6 to 1.5 volts for the parameters listed in table 520.

As shown in FIG. 11B, increasing the applied voltage V0 decreases the delay of the logic gate. For V0 at 1 volt, the delay of the logic gate is 1.3 ns, an increase of 30% as compared to the switching time of a single memristor.

Graph 530 of FIG. 11B illustrates the output signal of a memristor for different input combinations, V0=1 volt. The delay is evaluated as the time to switch the output memristor to logical zero when one input is logical one and the other input is logical zero (dashed line).

Graph 540 of FIG. 11B illustrates delays for different values of V0.

FIG. 12 includes a table 510 that illustrates design constraints of dual port pure memristive gates and of N input ports pure memristive gates according to an embodiment of the invention.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A device that comprises a pure memristive logic gate, wherein the pure memristive logic gate consists essentially of at least one input memristive device and an output memristive device that (a) is coupled to the at least one input memristive device, and (b) differs from the at least one input memristive device; wherein the pure memristive logic gate is controlled by a single control voltage; and wherein the pure memristive logic gate is arranged to operate in a first phase in which the output memristive device is initialized to a known value and a second phase in which the single control voltage is applied to one or more input memristive devices of the at least one input memristive device thereby affecting state of the output memristor that is an output of the pure memristive logic gate.

2. The device according to claim 1 wherein the polarity of the output memristive device is a same to a polarity of each input memristive device.

3. The device according to claim 1 wherein the pure memristive logic gate is integrated with a memristive device memory array.

4. The device according to claim 1 wherein the pure memristive logic gate is integrated with a memristive device crossbar that functions as a memristive memory array.

5. The device according to claim 4 wherein the pure memristive logic gate is a NOR logic gate.

6. The device according to claim 4 wherein the pure memristive logic gate is a NOT logic gate.

7. The device according to claim 1 wherein the pure memristive logic gate is a NOT logic gate that consists essentially of a single input memristive device that is serially coupled between a supplier of the single control voltage and the output memristive device.

8. The device according to claim 1 wherein the pure memristive logic gate is a NOR logic gate that consists essentially of multiple input memristive devices that are coupled in parallel to each other between a supplier of the single control voltage and the output memristive device; wherein a polarity of the multiple input memristive devices is opposite to a polarity of the output memristive device.

9. The device according to claim 1 wherein the pure memristive logic gate is a NAND logic gate that consists essentially of multiple input memristive devices that are coupled in serial to each other between a supplier of the single control voltage and the output memristive device, wherein a polarity of the multiple input memristive devices is opposite to a polarity of the output memristive device.

10. The device according to claim 1 wherein the pure memristive logic gate is an AND logic gate that consists essentially of multiple input memristive devices that are coupled in serial to each other between a supplier of the single control voltage and the output memristive device, wherein a polarity of the multiple input memristive devices is a same as a polarity of the output memristive device.

11. The device according to claim 1 wherein the pure memristive logic gate is an OR logic gate that consists essentially of multiple input memristive devices that are coupled in parallel to each other between a supplier of the single control voltage and the output memristive device; wherein a polarity of the multiple input memristive devices is a same as a polarity of the output memristive device.

12. The device according to claim 1 wherein the at least one input memristive device is a first input memristive device and a second input memristive device that are coupled in parallel to each other; wherein the output memristive device (a) is serially coupled to the first and second input memristive devices, (b) differs from the first and second input memristive devices, and (c) has a reverse polarity than the first and second input memristive devices; wherein the pure memristive logic gate is integrated with a memristive device crossbar that functions as a memristive memory array; and wherein the pure memristive logic gate is a NOR logic gate.

13. The device according to claim 12 wherein the first input memristive device is connected between a first row of the memristive device crossbar and a first column of the memristive device crossbar; wherein the second input memristive device is connected between a second row of the memristive device crossbar and the first column of the memristive device crossbar; and wherein the output memristive device is connected between a third row of the memristive device crossbar and the first column of the memristive device crossbar.

14. The device according to claim 12 wherein a state of the pure memristive logic gate is represented only as resistance.

15. A device that comprises a pure memristive logic gate, wherein the pure memristive logic gate consists essentially of at least one input memristive device and an output memristive device that (a) is coupled to the at least one input memristive device, and (b) differs from the at least one input memristive device; wherein the pure memristive device is controlled by a single control voltage; wherein a polarity of the output memristive device is reverse to a polarity of each input memristive device.

16. A method for performing a logic operation, the method comprises:
    initializing an output memristive device of a pure memristive logic gate to a known value; and
    applying a single control voltage to one or more input memristive device of at least one input memristive device of the pure memristive logic gate thereby affecting state of an output memristor that is an output of the pure memristive logic gate.

17. The method according to claim 16 wherein a polarity of the output memristive device is reverse to a polarity of each input memristive device.

18. The method according to claim 16 wherein the pure memristive logic gate is integrated with a memristive device memory array.

19. The device according to claim 16 wherein the pure memristive logic gate is integrated with a memristive device crossbar that functions as a memristive memory array.

* * * * *